(12) United States Patent  (10) Patent No.: US 7,252,199 B2
Johnson et al.  (45) Date of Patent: Aug. 7, 2007

(54) DISK CASSETTE SYSTEM

(75) Inventors: Michael L. Johnson, Minneapolis, MN (US); Carlos Cadavid, Chanhassen, MN (US); Ronald E. Thomas, Jr., Mount Baldy, CA (US); Andrews Harris, Minneapolis, MN (US)

(73) Assignee: Entegris, Inc., Chaska, MN (US)

( * ) Notice: Subject to any disclaimer, the term of this patent is extended or adjusted under 35 U.S.C. 154(b) by 79 days.

(21) Appl. No.: 11/087,379

(22) Filed: Mar. 23, 2005

(65) Prior Publication Data

US 2005/0263462 A1  Dec. 1, 2005

Related U.S. Application Data

(60) Provisional application No. 60/556,848, filed on Mar. 26, 2004.

(51) Int. Cl.
    *A47G 19/08* (2006.01)
(52) U.S. Cl. .................................................. 211/41.18
(58) Field of Classification Search ............. 211/41.18, 211/41.1, 41.2, 41.12, 41.17; 206/711
    See application file for complete search history.

(56) References Cited

U.S. PATENT DOCUMENTS 3,826,377 A     7/1974  Bachmann
3,926,305 A    12/1975  Wallestad
4,160,504 A     7/1979  Kudlich et al.
4,557,382 A    12/1985  Johnson
4,572,101 A     2/1986  Lee
4,669,612 A     6/1987  Mortensen
4,724,963 A     2/1988  Mortensen
4,779,724 A    10/1988  Benz et al.
4,779,732 A    10/1988  Boehm et al.
5,255,797 A    10/1993  Kos
D344,891 S      3/1994  Dressen
5,348,151 A     9/1994  Dressen
5,370,142 A    12/1994  Nishi et al.
5,472,086 A    12/1995  Holliday et al.
5,575,394 A    11/1996  Nyseth
5,586,658 A    12/1996  Nyseth
5,704,494 A     1/1998  Nishikiori et al.
5,921,397 A     7/1999  Whalen
6,446,806 B1 *  9/2002  Ohori et al. ................. 206/454
6,581,264 B2 *  6/2003  Ohori et al. ................. 29/426.1
RE38,221 E   *  8/2003  Gregerson et al. .......... 206/711
6,874,638 B2 *  4/2005  Iijima et al. ................. 206/711

\* cited by examiner

*Primary Examiner*—Sarah Purol
(74) *Attorney, Agent, or Firm*—Patterson, Thuente, Skaar & Christensen, P.A.

(57) ABSTRACT

A cassette system for disks to be manufactured into hard disks for computer memory storage includes a pair of end portions and a pair of side wall portions spanning between the end portions, defining a disk receiving region. The side wall portions together define a plurality of axially aligned slots for holding the disks. At least one of the end portions includes a test disk receiver, which may be a slot or pocket.

16 Claims, 4 Drawing Sheets

DISK CASSETTE SYSTEM

RELATED APPLICATIONS

This application claims the benefit of U.S. Provisional Patent Application No. 60/556,848, entitled DISK CASSETTE SYSTEM and filed on Mar. 26, 2004, hereby fully incorporated herein by reference.

FIELD OF THE INVENTION

The present invention relates to disk carriers, and more specifically, to cassettes for processing and packaging computer hard drive disk substrates.

BACKGROUND OF THE INVENTION

Substrate carriers configured for holding multiple hard disk substrates during fabrication and shipping are well known in the data storage device industry. Examples of such prior art carriers are described in U.S. Pat. Nos. 5,921,397; 5,704,494; 4,669,612; and 5,348,151, each of which is hereby fully incorporated herein by reference.

During processing of hard disks using known prior art carriers, a typical quality control practice involves designating one of the disks as a "test disk" for quality control inspection and lot identification. Testing may require the compromise or destruction of the test disk under examination. As a result, the yield of finished hard disks per batch is reduced at least by one disk, and the complexity of disk processing is increased due to post-processing tracking and handling of the designated test disk.

Also, disk processing often involves the baking of the disks at temperatures of up to 300° C. or higher. Consequently, handling of the disk carrier during processing is generally automated. A relatively high degree of precision in carrier positioning is desirable to minimize disk damage and particulate generation from improper indexing of the robotic tooling. Prior art carriers, while offering a generally workable degree of precision in positioning, are still sometimes mispositioned, resulting in disk damage or excessive particulates in the processing environment.

What is needed in the industry is a disk carrier that addresses the above-identified deficiencies in the prior art carriers.

SUMMARY OF THE INVENTION

The present invention addresses the need in the industry for a disk carrier that enables simpler processing of test disks and improved accuracy in automated positioning. According to an embodiment of the invention, a cassette system for disks to be manufactured into hard disks for computer memory storage includes a pair of end portions and a pair of side wall portions spanning between the end portions, defining a disk receiving region. The side wall portions together define a plurality of axially aligned slots for holding the disks. At least one of the end portions includes a test disk receiver, which may be a slot or pocket.

A further embodiment of the invention features a serrated flange on each of the side wall portions. These flanges may serve as a locating means for robotic or otherwise automated handling systems. The flanges are preferably configured asymmetrically to allow for the positive position sensing of the first disk.

A feature of an embodiment of the invention is the inclusion of a test disk receiver in one or both of the end frames for the insertion of a test specimen. The test disk receiver, which may be a pocket or slot, is preferably dimensioned to fit within the constraints of the cassette end portion.

An advantage of the end portion with test disk receiver according to the invention is that the test specimen eliminates the need for the designation of a processed hard disk for testing.

An additional feature of an embodiment of the invention is that the test disk may be of any configuration or geometry, thus readily discernable from the disks in process.

A further embodiment provides for the insertion of a test disk inserted in both of the cassette end portions. By providing two test disks, the confidence of the quality assessment can be improved by conducting tests on two samples if desired, without destroying otherwise valuable product.

An additional feature and advantage of the present invention is that the overall dimensions of the disk carrier remains unchanged, so that the number of disks processed in an industry standard base footprint remains the same.

Other objects and advantages of the present invention will be apparent to those skilled in the art upon reviewing the description, drawings and claims herein.

DETAILED DESCRIPTION OF THE PREFERRED EMBODIMENTS

Figure 1:
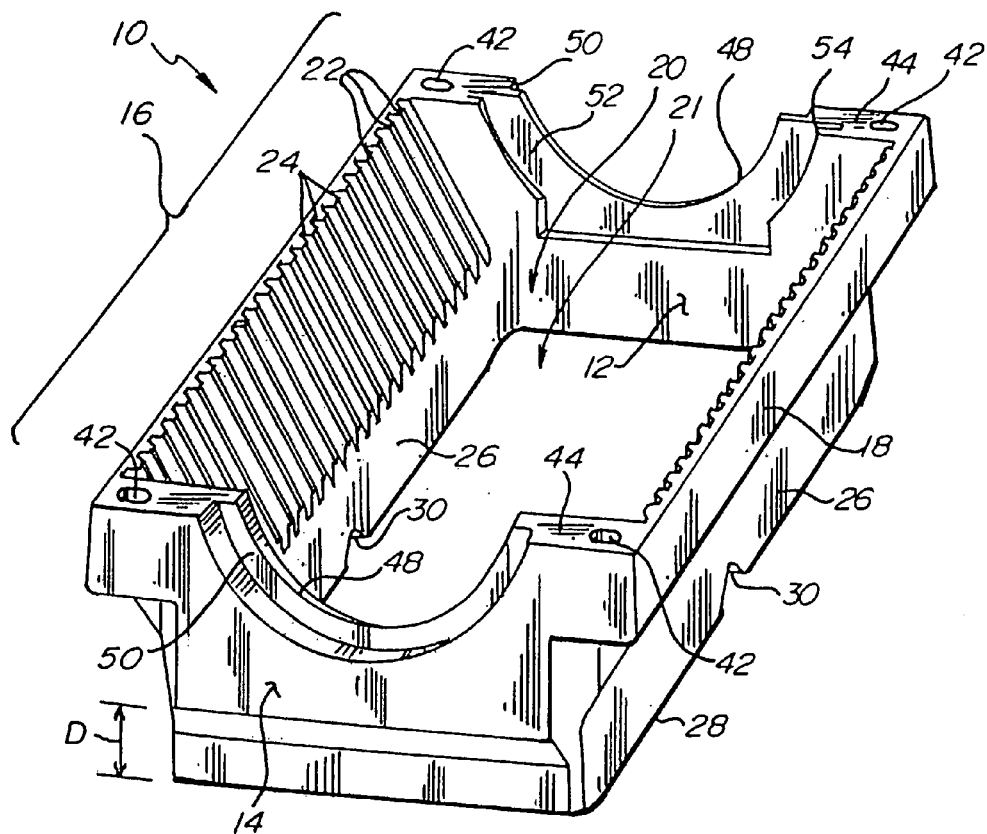
FIG. 1 is a top perspective view of a disk carrier according to an embodiment of the invention.
Figure 2:
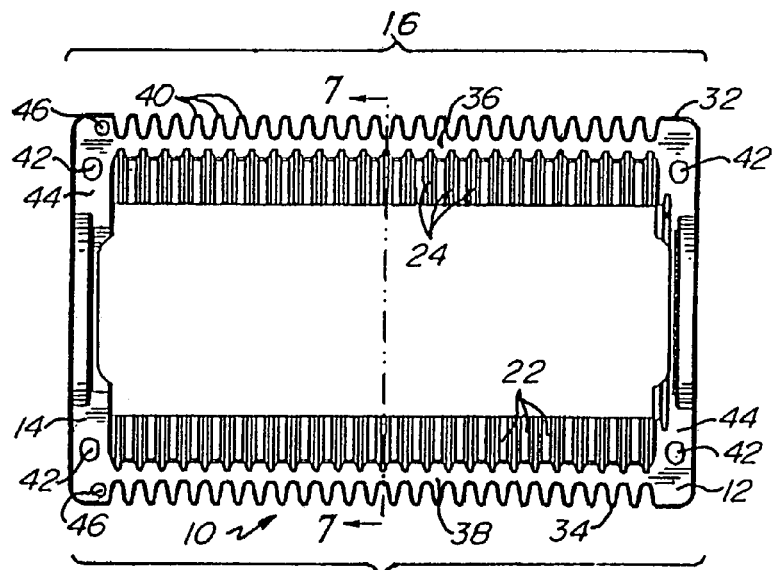
FIG. 2 is a top plan view of the disk carrier of FIG. 1.
Figure 3:
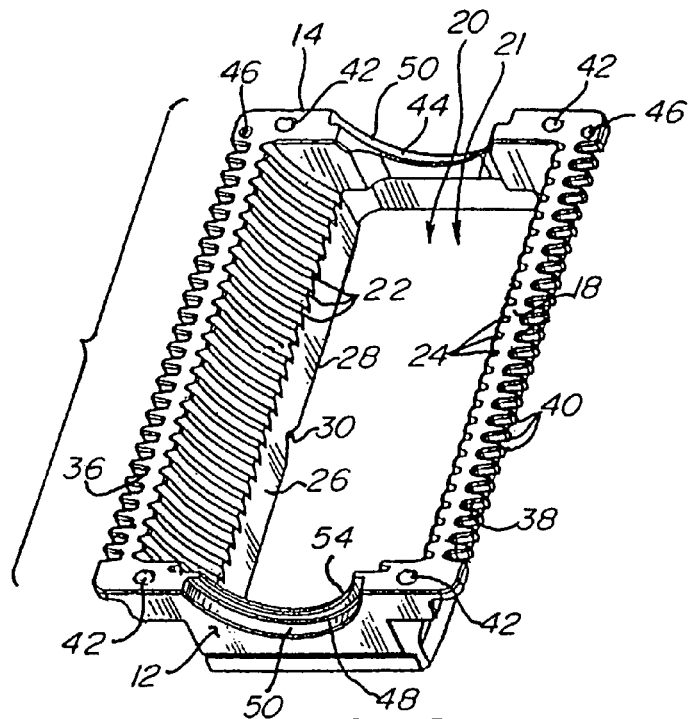
FIG. 3 is a top perspective view of an alternative embodiment of a disk carrier according to the invention.

As depicted in FIGS. 1-3, a disk carrier 10 according to an embodiment of the invention generally includes end structures 12, 14, and sidewalls 16, 18, which are arranged to define a generally rectangular disk receiving region 20 with an open bottom 21 to enable processing fluids to readily circulate around disks disposed in disk receiving region 20. Each of sidewalls 16, 18, has a plurality of ribs 22 oriented facing inwardly into disk receiving region 20 and arranged to form a plurality of slots 24. Each slot 24 is dimensioned to receive a single hard disk (not depicted), so that multiple hard disks may be held in disk carrier 10 in a spaced apart, axially aligned arrangement. Each sidewall 16, 18, may further include a lower stand-off skirt portion 26 presenting a depth dimension annotated "D" in the drawings. Depth dimension D may be selected so as to be sufficient to enable hard disks received in slots 24 to remain in position when bottom edge 28 of disk carrier 10 is set on a surface. Further, lower stand-off skirt portion 26 may include centering notch 30 to enable positive positioning of the disk carrier 10.

Referring to FIGS. 2 and 3, in an embodiment of the invention, outer edges 32, 34, of upper flanges 36, 38, of sidewalls 16, 18, may include multiple laterally projecting serrations 40, which may function as an indexing and locating means during automated handling of disk carrier 10. Preferably, serrations 40 extend the full length of outer edges 32, 34, between end structures 12, 14, to enable positive automated location and identification of the first slot 24 adjacent each end structure 12, 14.

End structures 12, 14, are spaced apart and positioned at opposing ends of sidewalls 16, 18. One or more apertures 42 may be provided in top surface 44 of each end structure 12, 14, for receiving a carrying device (not depicted) to enable robotic transport of disk carrier 10. Index structures 46, which may be apertures or holes, are provided on end structure 14 to enable automated differentiation of end structures 12, 14. Each end structure 12, 14, may have a radiused cutout 48, with an outwardly facing relieved portion 50 for receiving a cover (not depicted). Disk carrier 10 may be fitted with both a top cover and a bottom cover, as described in U.S. Pat. No. 4,557,382, hereby fully incorporated by reference herein.

According to an embodiment of the invention, at least end structure 12 includes a test disk receiver 52, which may be configured as a slot or pocket 54. It will be appreciated that the geometry and dimensions of pocket 54 may be selected so as to accommodate any desired shape or size of test disk, which need not be of the same dimensions or geometry as the disks under process in slots 24. Slot or pocket 54 may be integral with end structure 12 as depicted in FIG. 1, or may be defined as a recess in end structure 12 covered with a separate cover piece (not depicted). In another alternative embodiment, slot or pocket 54 may be defined in an entirely separate structure, which is then affixed to end structure 12 using any means of sufficient strength and durability to withstand the processing environment of the hard disks. In a still further alternative embodiment, slots or pockets 54 may be provided in both end structures 12, 14, using any of the described configurations.

Disk carrier 10 may be made from any material or combination of materials suitable for the processing environment. The preferred material is aluminum, which is forged or machined to the desired dimensions and tolerances, but alternatively, other metals may be used, as well as polymers or thermoplastics such as polyetheretherketone (PEEK) as temperatures permit.

Figure 4:
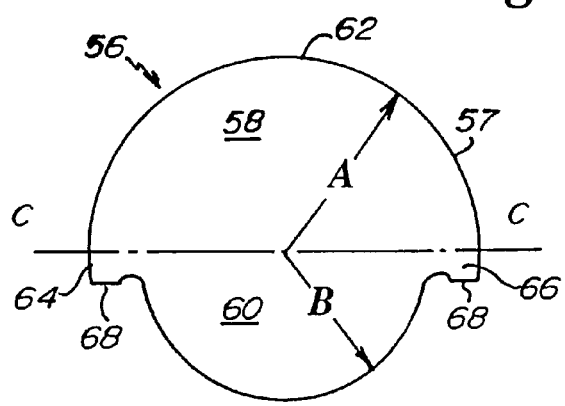
FIG. 4 is a front view of a test disk according to an embodiment of the invention.
Figure 4A:
FIG. 4A is an edgewise view of the test disk of FIG. 4.

An exemplary configuration of a test disk 56 for use with an embodiment of disk carrier 10 is depicted in FIGS. 4 and 4A. Test disk 56 generally includes a planar body 57 having an upper portion 58, a lower portion 60 and presenting a periphery 62. Periphery 62 is generally arcuate in shape, with upper portion 58 having a first radius dimension annotated in FIG. 4 as "A", and with lower portion 60 having a relatively smaller radius dimension, annotated in FIG. 4 as "B" At the intersection of upper portion 58 and lower portion 60, the difference in radius defines a pair of shoulders 64, 66. A linear portion 68 running generally parallel to a horizontal disk axis C-C through the centers of radii A and B is preferably defined in periphery 62 at each of shoulders 64, 66.

In use, lower portion 60 of test disk 56 is inserted in pocket 54 of disk carrier 10. Pocket 54 is dimensioned so that linear portions 68 contact top surface 44 of end portion 12. Test disk 56 is thereby supported in pocket 54 on shoulders 64, 66, with upper portion 58 extending upwardly from top surface 44 so as to be readily exposed to the processing fluids.

Figure 5:
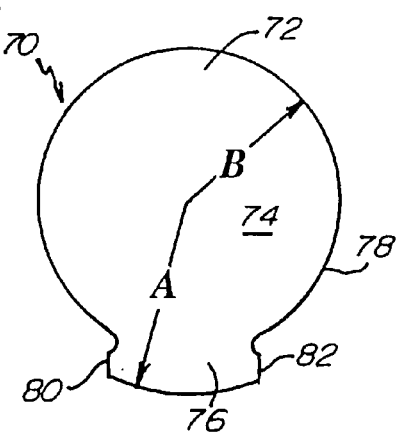
FIG. 5 is a front view of a test disk according to an alternative embodiment of the invention.
Figure 5A:
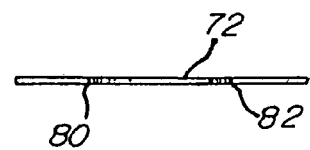
FIG. 5A is an edgewise view of the test disk of FIG. 5.
Figure 6:
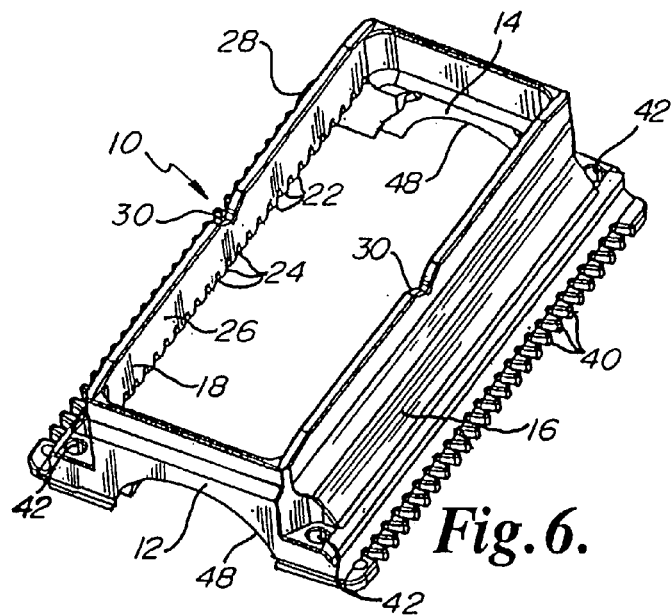
FIG. 6 is a bottom perspective view of a disk carrier according to an embodiment of the invention.
Figure 7:
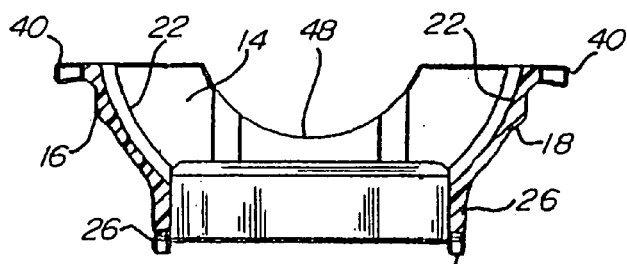
FIG. 7 is cross-sectional view of the disk carrier of FIG. 2 taken at section 7-7.
Figure 8:
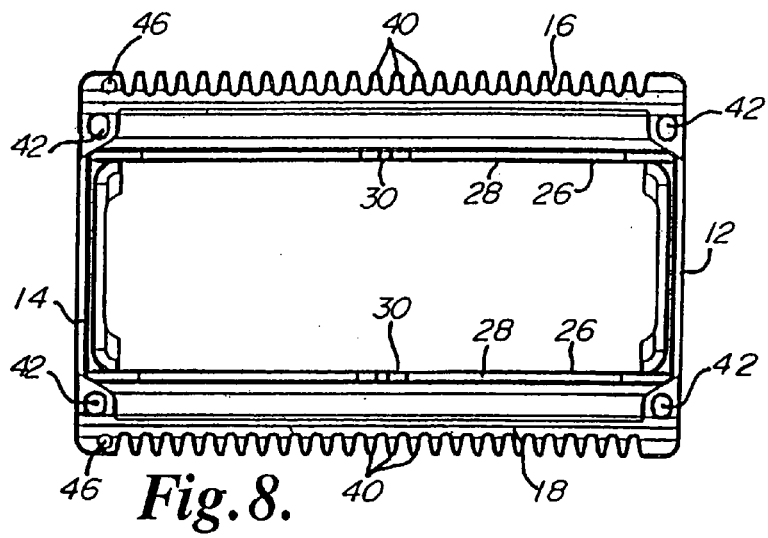
FIG. 8 is a bottom plan view of an embodiment of a disk carrier according to the invention.
Figure 9:
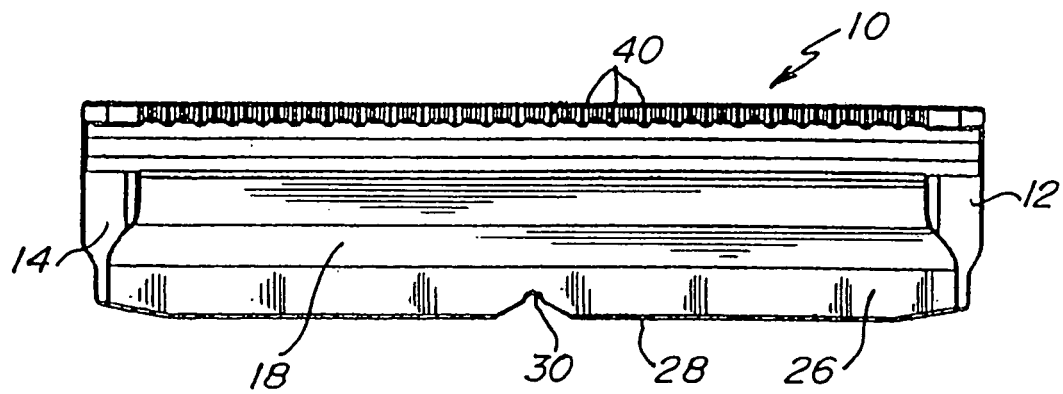
FIG. 9 is a side elevation view of the disk carrier of FIG. 8.
Figure 10:
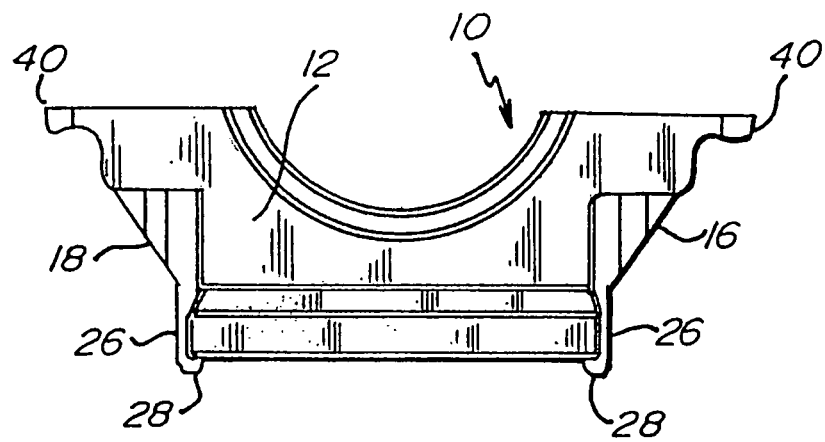
FIG. 10 is an end elevation view of the disk carrier of FIG. 8.

An alternative embodiment of a test disk 70 is depicted in FIGS. 5 and 5A. Test disk 70 generally includes a planar body 72 having an upper portion 74, a lower portion 76 and presenting a periphery 78. Periphery 78 is again generally arcuate in shape, however, in this embodiment, upper portion 74 is configured as a disk with a first radius dimension annotated in FIG. 5 as "B", and lower portion 76 is configured as a tab extending from upper portion 74 and with a relatively larger radius dimension, annotated in FIG. 5 as "A." Lower portion 76 has a pair of opposing sides 80, 82, which may be defined as generally parallel to a vertical axis of symmetry through test disk 70.

In use, lower portion 76 is inserted in pocket 54 of end portion 12. In this embodiment, pocket 54 is dimensioned so that the radiused bottom edge 84 of lower portion 76 rests on the bottom of pocket 54, thereby supporting the disk in place. As before, at least a portion of upper portion 74 extends upwardly from top surface 44 so as to be readily exposed to processing fluids.

Although the depicted embodiments each include a test disk with a dual radiused periphery, any other configuration or geometric shape of test disk may be used within the scope of the present invention. In this regard, pocket 54 and/or the test disk may be made to conform each with the other in any desired shape, size or configuration.

While only certain embodiments have been set forth in detail in the detailed description, other alternative embodiments and modifications within the scope of the present invention will be evident therefrom to those of skill in the art. Accordingly, the scope of the invention is not limited to the particular embodiments described, but only by the claims included herein.

What is claimed is:

1. A substrate carrier system for processing and transporting a plurality of data storage disks, the system comprising:
   a test disk; and
   a carrier including a pair of spaced apart end structures and a pair of spaced apart sidewalls extending between the end structures defining a disk receiving region, each of the spaced apart sidewalls having a plurality of ridges facing into the disk receiving region so as to define a plurality of slots, each slot for receiving a separate one of the plurality of data storage disks, at least one of the end structures having a disk receiving portion for holding the test disk, wherein the disk receiving portion is a pocket defined in the at least one end structure.

2. The system of claim 1, wherein the test disk presents a periphery having a first portion with a first radius dimension and a second portion with a second radius dimension, and wherein the second radius dimension is larger than the first radius dimension.

3. The system of claim 2, wherein the test disk includes a pair of spaced apart shoulder portions, and wherein the test disk is supported through contact of the shoulder portions with the at least one end structure of the carrier when the test disk is received in the disk receiving portion.

4. The system of claim 2, wherein the first portion of the test disk comprises a generally circular main body portion and the second portion of the test disk comprises a tab portion projecting from the main body portion.

5. The system of claim 1, wherein each of the sidewalls has an upper flange with an outer edge, the outer edge of each upper flange having a plurality of laterally extending serrations formed therein.

6. The system of claim 1, wherein the each of the sidewalls includes a lower skirt portion for supporting the carrier on a surface.

7. The system of claim 6, wherein at least one of the lower skirt portions includes a positioning notch defined in a lower edge thereof.

8. A substrate carrier system for processing and transporting a plurality of data storage disks, the system comprising:
   a test disk; and
   a carrier including a pair of spaced apart end structures and a pair of spaced apart sidewalls extending between the end structures defining a disk receiving region, each of the spaced apart sidewalls having a plurality of ridges facing into the disk receiving region so as to define a plurality of slots, each slot for receiving a separate one of the plurality of data storage disks, at least one of the end structures including means for holding the test disk, wherein the means for holding the test disk includes a pocket defined in the at least one end structure.

9. The system of claim 8, wherein each end structure includes means for holding the test disk.

10. The system of claim 8, wherein the test disk presents a periphery having a first portion with a first radius dimension and a second portion with a second radius dimension, and wherein the second radius dimension is larger than the first radius dimension.

11. The system of claim 10, wherein the test disk includes a pair of spaced apart shoulder portions, and wherein the test disk is supported through contact of the shoulder portions with the at least one end structure of the carrier when the test disk is received in the means for holding the test disk.

12. The system of claim 10, wherein the first portion of the test disk comprises a generally circular main body portion and the second portion of the test disk comprises a tab portion projecting from the main body portion.

13. The system of claim 8, wherein each of the sidewalls has an upper flange with an outer edge, the outer edge of each upper flange having a plurality of laterally extending serrations formed therein.

14. The system of claim 8, wherein the each of the sidewalls includes a lower skirt portion for supporting the carrier on a surface.

15. The system of claim 14, wherein at least one of the lower skirt portions includes a positioning notch defined in a lower edge thereof.

16. A method for batch processing a plurality of data storage disks with a separate quality control test disk, the method comprising steps of:
   providing a carrier including a pair of spaced apart end structures and a pair of spaced apart sidewalls extending between the end structures defining a disk receiving region, each of the spaced apart sidewalls having a plurality of ridges facing into the disk receiving region so as to define a plurality of slots, at least one of the end structures including a pocket for holding the test disk;
   disposing a separate one of the plurality of data storage disks in each of the slots of the carrier; and
   disposing the test disk in the pocket.

* * * * *